(12) United States Patent
Park

(10) Patent No.: US 7,772,624 B2
(45) Date of Patent: Aug. 10, 2010

(54) IMAGE SENSORS AND METHODS OF FABRICATING SAME

(75) Inventor: Won-Je Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 781 days.

(21) Appl. No.: 11/426,974

(22) Filed: Jun. 28, 2006

(65) Prior Publication Data

US 2007/0012966 A1    Jan. 18, 2007

(30) Foreign Application Priority Data

Jul. 13, 2005    (KR) .................. 10-2005-0063392

(51) Int. Cl.
    *H01L 31/062* (2006.01)
(52) U.S. Cl. .................. 257/292; 257/E27.133; 257/E29.279
(58) Field of Classification Search .............. 438/48, 438/66, 300, 306; 257/290–293, E27.133, 257/E29.279
    See application file for complete search history.

(56) References Cited

U.S. PATENT DOCUMENTS

| 6,040,593 | A | * | 3/2000 | Park ........................ 257/292 |
| 6,084,259 | A | * | 7/2000 | Kwon et al. ................ 257/292 |
| 6,333,205 | B1 | * | 12/2001 | Rhodes ..................... 438/69 |
| 6,984,537 | B2 | * | 1/2006 | Fossum ..................... 438/22 |
| 7,009,227 | B2 | * | 3/2006 | Patrick et al. .............. 257/233 |
| 7,214,976 | B2 | * | 5/2007 | Uchida et al. .............. 257/292 |
| 2004/0251482 | A1 | | 12/2004 | Rhodes |

FOREIGN PATENT DOCUMENTS

| JP | 05-291550 | 11/1993 |
| KR | 1020040036086 A | 4/2004 |

OTHER PUBLICATIONS

Wang, CC., "A Study of CMOS Technologies for Image Sensor Applications, Chapter 5—The Effect of Hot Carriers on the Operation of CMOS Active Pixel Sensors," Doctorate Thesis, Aug. 2001, pp. 117-134, http://www-mtl.mit.edu/researchgroups/sodini/ginger%20wangthesis.pdf.

\* cited by examiner

*Primary Examiner*—Khiem D Nguyen
(74) *Attorney, Agent, or Firm*—Myers Bigel Sibley & Sajovec

(57) ABSTRACT

Image sensor devices are provided having reduced dark current generation characteristics. These image sensor devices include a semiconductor substrate and a photo-detector therein (e.g., P-N photodiode). The photo-detector includes a charge-generating region therein that is configured to convert photons received by the photo-detector into charge carriers. A first transistor, which has a terminal configured to receive the charge carriers generated by the photo-detector, is also provided. The first transistor includes a first gate electrode and a first pair of lightly doped source and drain regions of unequal width on opposite sides of the first gate electrode. This first transistor may be a three-terminal device and the terminal that is configured to receive the charge carriers may be selected from a group consisting of a gate, source and drain terminals. In particular, the first transistor may be configured as a reset transistor or as a source-follower transistor.

14 Claims, 10 Drawing Sheets

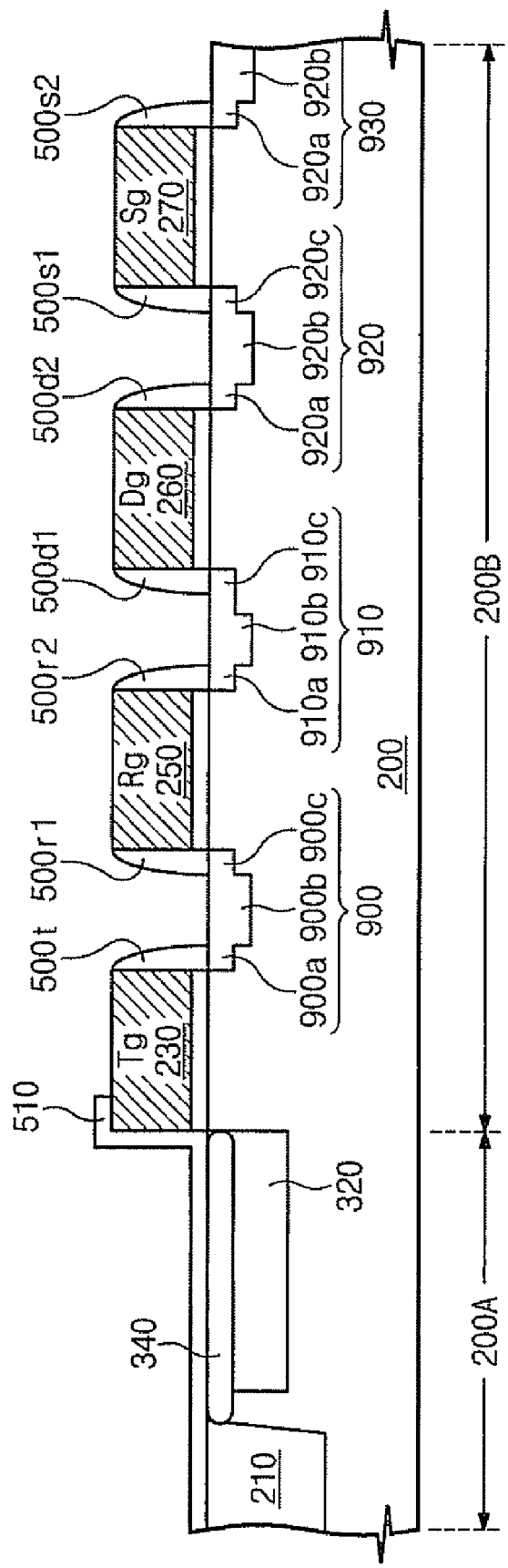

IMAGE SENSORS AND METHODS OF FABRICATING SAME

REFERENCE TO PRIORITY APPLICATION

This U.S. non-provisional patent application claims priority under 35 U.S.C. §119 to Korean Patent Application 2005-63392, filed Jul. 13, 2005, the entire contents of which are hereby incorporated herein by reference.

FIELD OF THE INVENTION

The present invention relates to image sensors and methods of fabricating the same and, more particularly, to CMOS image sensors and methods of fabricating the same.

BACKGROUND OF THE INVENTION

Image sensors are devices that can transform optical images into electrical signals. Image sensors are typically classified into charge-coupled devices (CCD) and CMOS image sensors. The CCD has a plurality of MOS capacitors and operates by moving charges that are generated by optical light. The CMOS image sensor includes a plurality of unit pixels and a CMOS circuit controlling output signals from each unit pixel.

The CCD has several disadvantages such as requiring relatively complicated operation and manufacturing processes, consuming relatively large amounts of power, and being difficult in integrating a signal processing circuit on a CCD chip. A CMOS image sensor, however, can be more easily fabricated because CMOS image sensors can be manufactured using conventional CMOS technology.

Conventional CMOS image sensors may be degraded because of reductions in charge transmission efficiency and reductions in charge storage capacity due to noise or dark currents. Dark currents, which result from the accumulation of charges without optical incidence from photo-detecting devices, have been treated as being generated from silicon dangling bonds or defects on silicon substrate surfaces; however, hot carriers may also be a major factor in generating dark currents.

As described in an article by C. C. Wang et al., entitled "The Effect of Hot Carriers on the Operation of CMOS Active Pixel Sensors," IEDM Tech. Dig., 2001, pp. 563-566, hot carriers arising from transistors within the active pixel sensor, specifically, from pinch-off regions of source follower transistors, can raise a substrate potential and make drain-to-source currents (Ids) of the transistors higher. As these currents are increased, the hot carriers are further generated to thereby increase the dark current and degrade image quality effect.

SUMMARY OF THE INVENTION

Embodiments of the present invention include image sensor devices having reduced dark current generation characteristics. These image sensor devices include a semiconductor substrate and a photo-detector therein. The photo-detector includes a charge-generating region therein that is configured to convert photons received by the photo-detector into charge carriers. A first transistor, which has a terminal configured to receive the charge carriers generated by the photo-detector, is also provided. The first transistor includes a first gate electrode and a first pair of lightly doped source and drain regions of unequal width on opposite sides of the first gate electrode. This first transistor may be a three-terminal device and the terminal that is configured to receive the charge carriers may be selected from a group consisting of a gate, source and drain terminals. In particular, the first transistor may be configured as a reset transistor or as a source-follower transistor. In the event the first transistor is a reset transistor, then the first transistor may have a first lightly doped drain region and a first lightly doped source region that is narrower than the first lightly doped drain region. This first lightly doped drain region may be electrically coupled to a power supply terminal (e.g., Vdd) of the image sensor device. A source-follower transistor may be configured to have a second lightly doped drain region and a second lightly doped source region that is narrower than the second lightly doped drain region. A transfer transistor may also be provided having a first source/drain region electrically connected to the charge generating region and a second source/drain region electrically connected to a floating diffusion region (FDR) extending in the semiconductor substrate.

Additional embodiments of the invention include methods of forming the image sensor devices described herein.

BRIEF DESCRIPTION OF THE FIGURES

The accompanying drawings are included to provide a further understanding of the invention, and are incorporated in and constitute a part of this specification. The drawings illustrate example embodiments of the invention and, together with the description, serve to explain principles of the present invention. In the figures:

FIGS. 10-11 are cross-sectional views of intermediate structures that illustrate methods of fabricating an image sensor in accordance with a second embodiment of the invention.

DETAILED DESCRIPTION OF PREFERRED EMBODIMENTS

Exemplary embodiments of the present invention will now be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art.

Exemplary embodiments of the present invention are relevant to image sensors such as CCD devices and CMOS image sensors, especially to CMOS image sensors and methods of fabricating the same. A unit pixel of the CMOS image sensor may comprise a photo-detector element and transistors for transferring and outputting charges generated in the photo-detector element. The unit pixel of the CMOS image sensor may include various numbers of the transistor. For example, the unit pixel of the CMOS image sensor may be configured to include one, three, four, five, or six transistors, for example. For purposes of discussion herein, a CMOS image sensor with a unit pixel having four transistors will be described. However, the invention is not limited to only the embodiments described herein, but may be applicable to various configurations of CMOS image sensors with pixels each having one, three, five, or six transistors, and so forth. Further, the invention is also applicable to other types of CMOS image sensors having a unit pixel that includes a photo-detector element and transistors.

Figure 1:
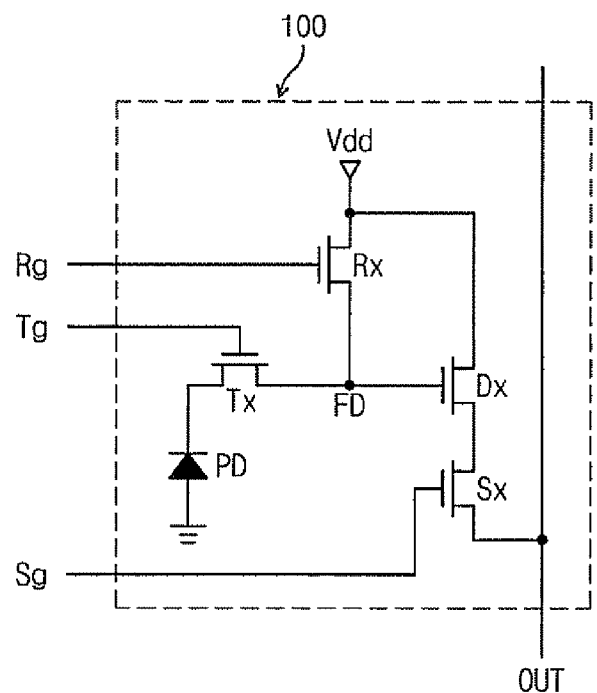
FIG. 1 is an equivalent circuit view of a conventional unit pixel for an image sensor.

FIG. 1 is an equivalent circuit of a unit pixel for an image sensor of exemplary embodiments of the present invention. Referring to FIG. 1, the unit pixel 100 includes a photodiode PD, and four transistors. These transistors include a transfer transistor Tx, a reset transistor Rx, a source-follower transistor Dx, and a selection transistor Sx. The unit pixel 100 further includes a floating diffusion region FD at a side of the transfer transistor Tx.

Figure 2:
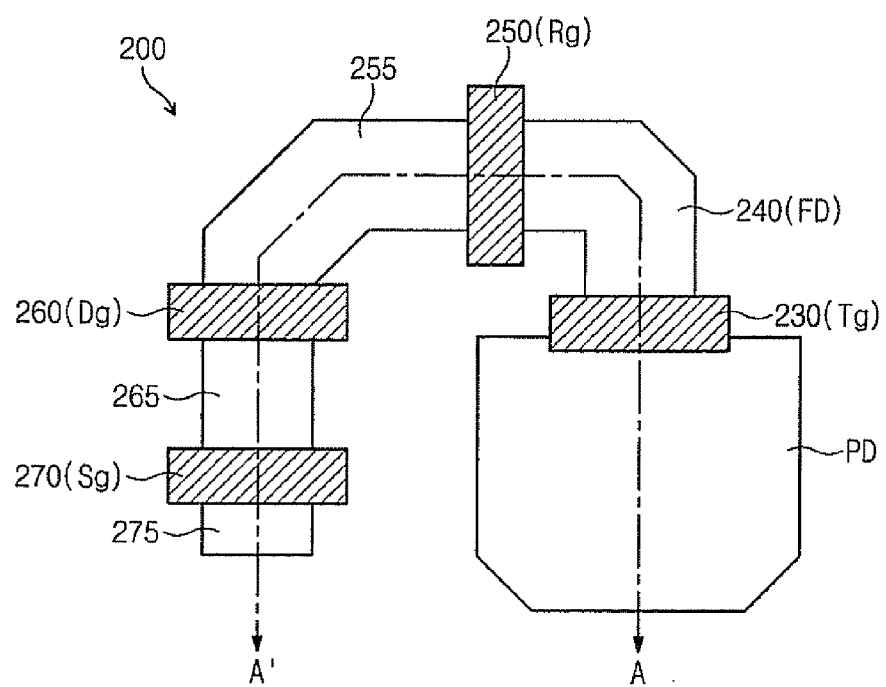
FIG. 2 is a layout view of the unit pixel shown in FIG. 1.

FIG. 2 is a layout view of transistors defining a unit pixel having the electrical configuration shown in FIG. 1. Referring to FIG. 2, a substrate 200 includes a first active pattern, where the photodiode PD is defined by a field oxide film, and a second active pattern where the transistors are formed. In the second active pattern, there are arranged a transfer gate 230, a reset gate 250, a source-follower gate 260, and a selection gate 270. In the second active pattern between the gates, impurity diffusion regions 240, 255, 265, 275 are formed. The impurity diffusion region 240 between the transfer gate 230 (Tg) and the reset gate 250 (Rg) serves as a floating diffusion region 240 (FD). Respective gate and impurity diffusion regions on both sides of the respective gate form a transistor. An impurity diffusion region can serve as a source region or drain region depending on a voltage applied thereto. Usually, in an N-channel transistor, the impurity diffusion region to which a higher voltage is applied functions as a drain region and the impurity diffusion region to which a lower voltage (e.g., ground voltage) is applied functions as a source region. Thus, the impurity diffusion region between the source-follower gate 260 (Dg) and the selection gate 270 (Sg) may act as a drain or source depending on a voltage applied thereto. The floating diffusion region 240 is electrically connected to the source-follower gate 260 of the source-follower transistor Dx by way of local interconnection, as illustrated by FIG. 1.

An operation of the CMOS image sensor will now be described with reference to FIGS. 1 and 2. When a gate-on voltage is applied to the reset gate 250, the reset transistor Rx is turned on to initialize the floating diffusion region 240. And, a gate-on voltage is applied to the transfer gate 230 to turn the transfer transistor Tx on, so that signal charges generated by external light incident in the photodiode element PD are transferred to the floating diffusion region 240. Accordingly, a voltage corresponding to charges transferred to the floating diffusion region 240 is applied to the source-follower gate 260 of the source-follower transistor Dx. When an external voltage Vdd is applied to the drain 255 of the source-follower transistor Dx, a potential value by a voltage of the source-follower gate 260 is amplified and transferred to the source 265 of the source-follower transistor Dx. Thus, in selecting and driving a pixel, the gate-on voltage applied to the selection gate 270 turns the selection transistor Sx on and thereby the signal charges transferred to the source 265 of the source-follower transistor Dx are output through the drain 275 of the selection transistor Sx.

Figure 3:
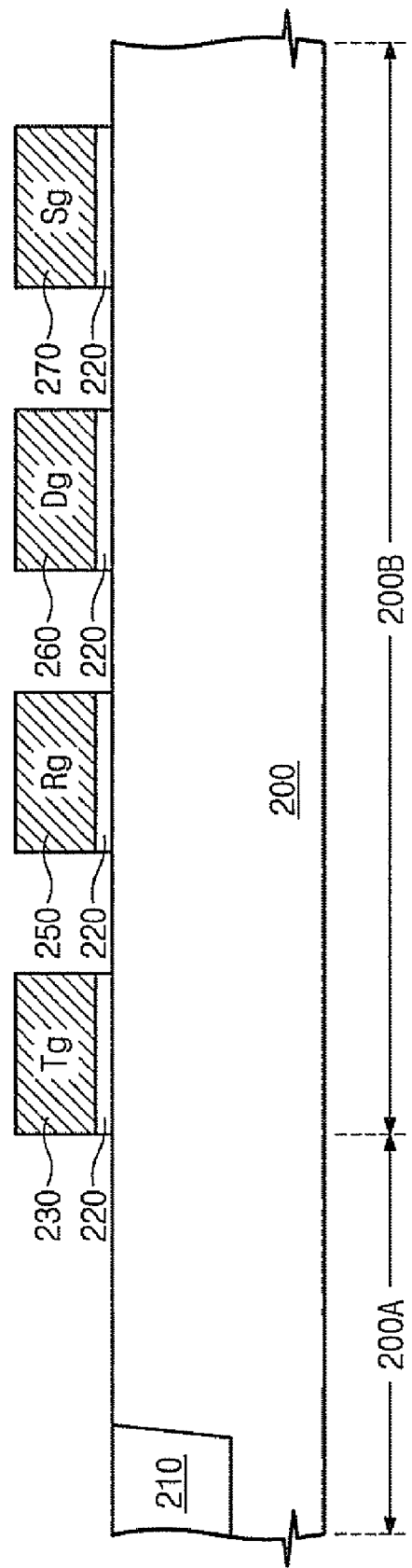
FIGS. 3 through 9 are cross-sectional views of intermediate structures that illustrate methods of fabricating an image sensor in accordance with a first embodiment of the invention.

FIGS. 3 through 8 are sectional views illustrating processing features for fabricating an image sensor in accordance with a first embodiment of the invention, taken along with the line A-A' of FIG. 2. Referring to FIG. 3, a semiconductor substrate 200 is provided. A shallow trench isolation (STI) process is carried out to form a field oxide film 210 in the semiconductor substrate 200 and define active patterns 200A and 200B in which the photo-detective element and transistors are to be formed. The active pattern 200A is provided for the photodiode PD as a photo-detective element, while the active pattern 200B is provided for the transistors. After forming a gate insulation film 220 on the active pattern 200B of the substrate 200 and forming a conductive film thereon, a patterning process is carried out to form the gate patterns 230, 250, 260, and 270. These gate patterns include the transfer gate Tg, the reset gate kg, the source-follower gate Dg, and the selection gate Sg.

Figure 4:
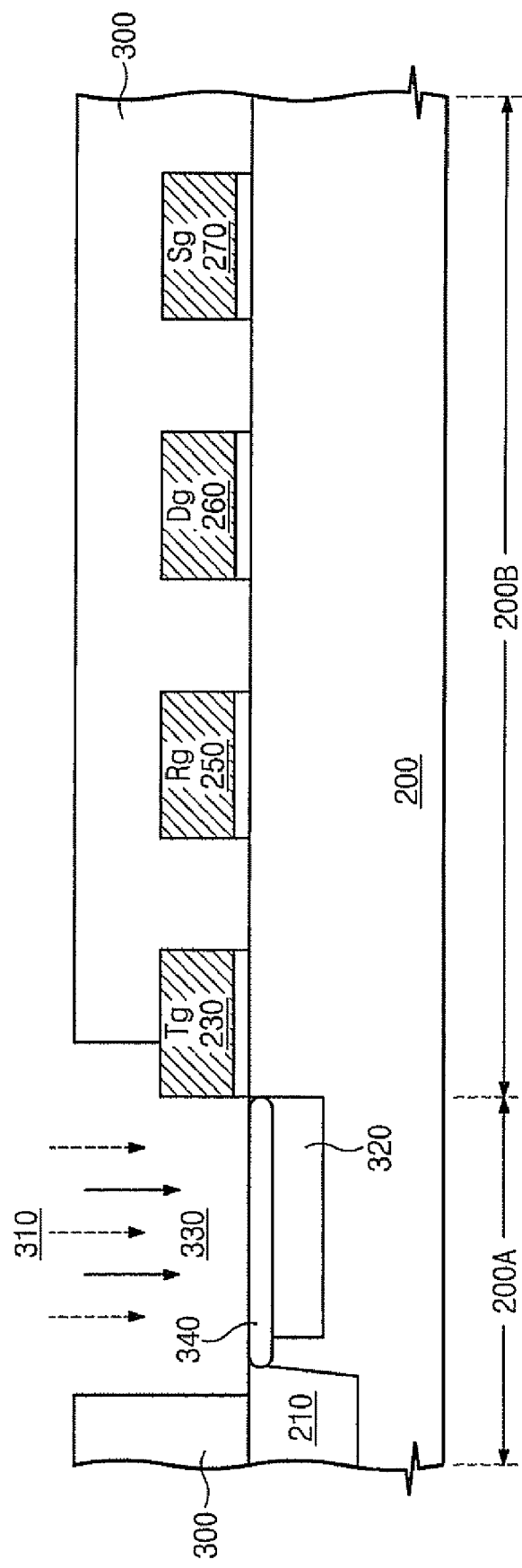

Referring to FIG. 4, a first ion-implantation mask 300 is arranged to form the photodiode 320 and a hole accumulation diode (HAD) region 340 in the active region 200A. The first ion-implantation mask 300 is formed to expose the active pattern 200A where the photodiode PD is to be formed, and block the active pattern 200B where the transistors are to be formed. The first ion-implantation mask 300 may be formed of a photoresist film. For example, the first ion-implantation mask 300 is patterned to expose regions for the photodiode 320 and a part of the transfer gate 230, adjacent to the regions for the photodiode 320. Ion impurities 310, such as phosphorous (P) or arsenic (As), are then implanted into the active pattern 200A of the semiconductor substrate 200, to thereby form the photodiode 320 with N-type conductive layer extending to a predetermined depth. Ion impurities 330, such as boron (B) or boron fluoride ($BF_2$), are implanted into the surface of the photodiode 320 to thereby form the HAD region 340 with P-type conductivity. As illustrated, one implant mask 300 may be used to guide both N-type and P-type implantation steps.

Figure 5:
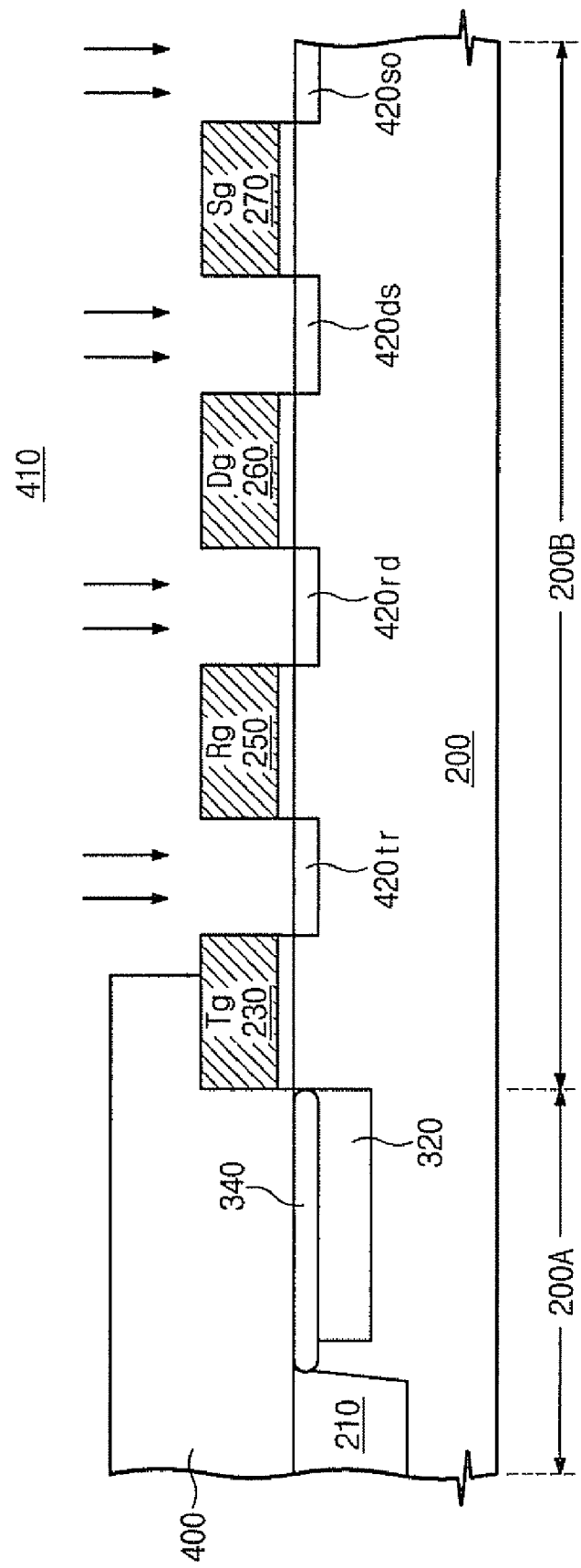

Referring to FIG. 5, a second ion-implantation mask 400 is then defined. This second mask 400 covers the active pattern 200A, including the photodiode 320, but exposes the active pattern 200B where the transistors are to be formed. For instance, the second ion-implantation mask 400 is formed to cover the photodiode 320 and a part of the transfer gate 230 adjacent to the photodiode 320. The second ion-implantation mask 400 may be made of a photoresist film. The lightly doped regions, 420tr, 420rd, 420ds, and 420so, are formed in the active pattern 200B by injecting ion impurities 410 with phosphorous (P) or arsenic (As), at a dose in a range between about $1\times10^{13}$ atoms/$cm^2$ and about $5\times10^{14}$ atoms/$cm^2$. The lightly doped regions, 420tr, 420rd, 420ds, and 420so, are formed in the active pattern 200B and are self-aligned to the gate patterns 230, 250, 260, and 270, respectively.

Figure 6:
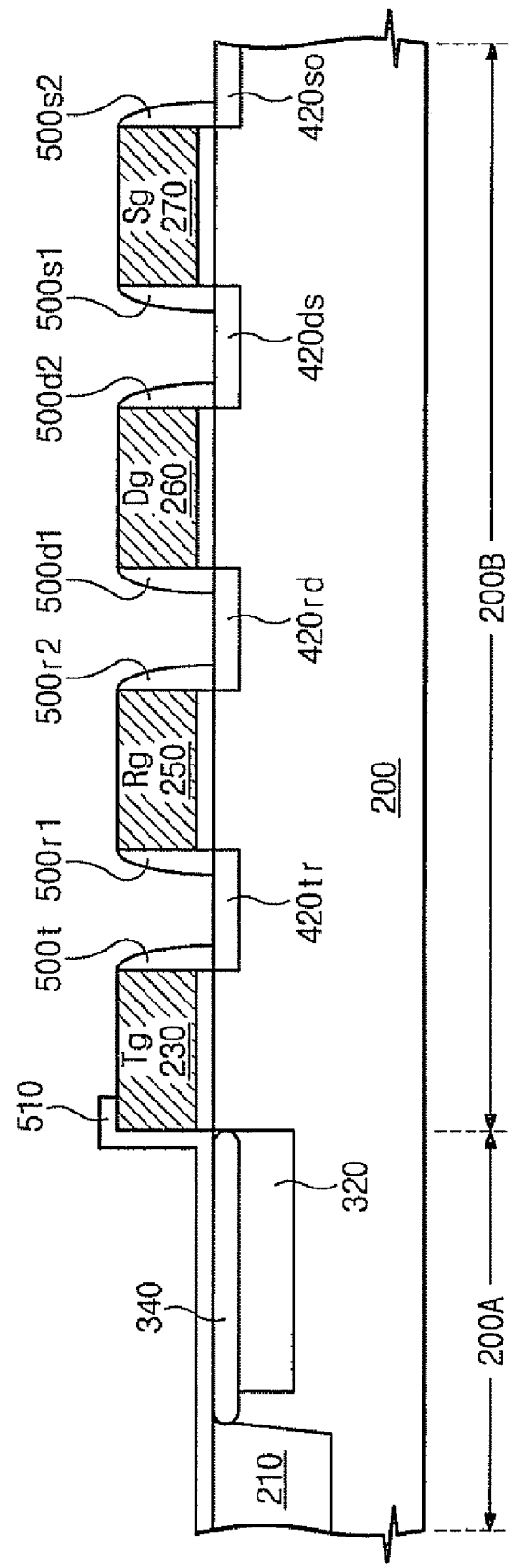

Referring to FIG. 6, a silicon nitride film (not shown) is formed over the semiconductor substrate 200 and then etched away to form spacers, 500t, 500r1, 500r2, 500d1, 500d2, 500s1, and 500s2, at both sidewalls of the gate patterns. During this step, a blocking layer 510 is formed that covers the photodiode 320 and partially covers the transfer gate 230. This blocking layer 510 inhibits contamination (e.g., impurity/dopant contamination) of the photodiode 320/340 while the spacers are being formed.

Figure 7:
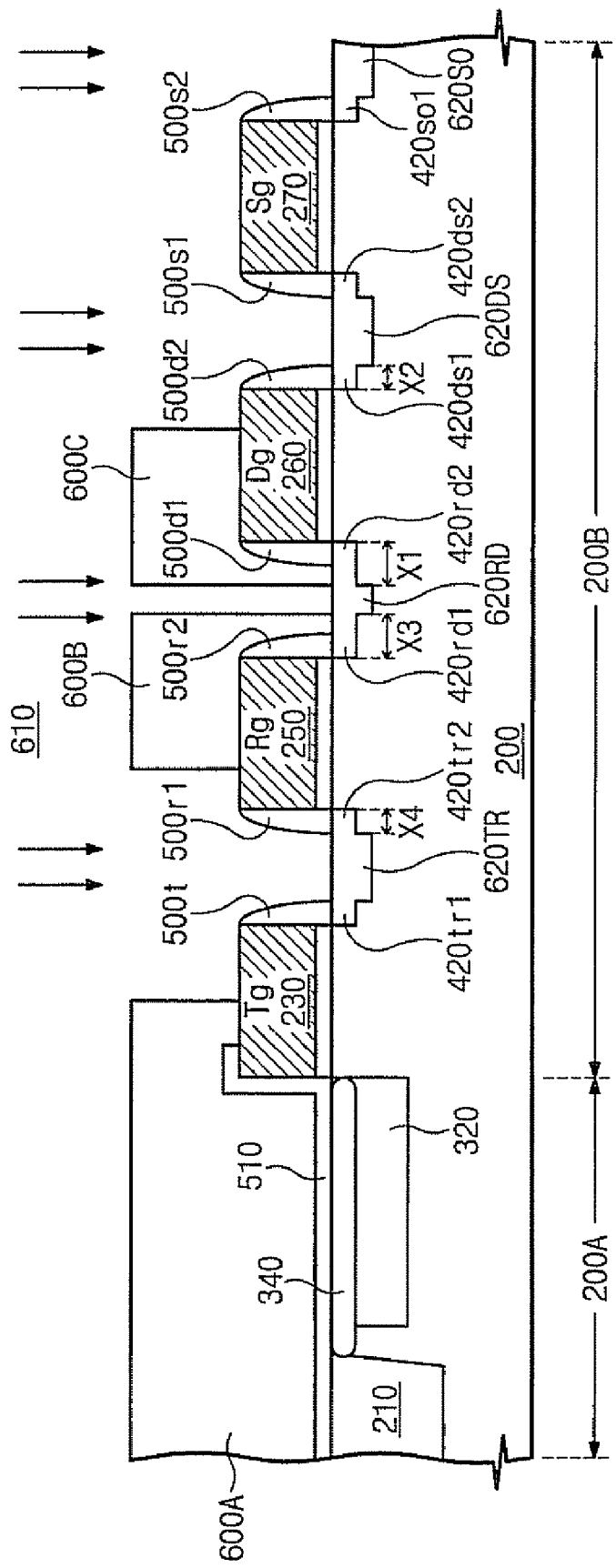

Referring to FIG. 7, third ion-implantation masks, 600A, 600B, and 600C, are arranged to enable formation of heavily doped regions. The third ion-implantation mask 600A covers the photodiode 320. In order to define asymmetrical lightly doped regions at both sidewalls of the source-follower gate (Dg) 260 (i.e., lightly doped regions of a different width), the third ion-implantation masks 600B and 600C are formed on the source-follower gate 260 and/or on the reset gate (Rg) 250, such that the third ion-implantation masks, 600B and 600C, are formed to partially cover the lightly doped region 420$rd_2$ adjacent to the source-follower gate (Dg) 260, or the lightly doped region 420$rd_1$ adjacent to the reset gate (Rg) 250, or both the lightly doped regions 420$rd_1$ and 420$rd_2$. For instance, the third ion-implantation mask 600A is formed on the photodiode 320 and a part of the transfer gate 230. The third ion-implantation mask 600C is arranged to cover the spacer 500d1 at the sidewall of the source-follower gate 260 and partially the semiconductor substrate 200 adjacent to the spacer 500d1. Here, it is preferred to further form the third ion-implantation mask 600C on a part of the source-follower gate 260. The third ion-implantation mask 600B is arranged to cover the spacer 500r2 at the sidewall of the reset gate 250 and partially the semiconductor substrate 200 adjacent to the spacer 500r2. Here, it is preferred to further form the third ion-implantation mask 600B on a part of the reset gate 250.

Ion impurities 610 of phosphorous (P) or arsenic (As) are implanted into the substrate 200 using the third ion-implantation masks 600A, 600B, and 600C as an implant mask at $1\times10^{15}$ atoms/cm$^2$ and $9\times10^{15}$ atoms/cm$^2$, to thereby form the heavily doped regions 620TR, 620RD, 620DS, and 620SO of N-type conductive layers. These heavily doped regions are self-aligned to the gate spacers 500t, 500r1, 500d2, 500s1, and 500s2, or the third ion-implantation masks 600B and 600C. For example the heavily doped region 620ID between the source-follower gate 260 and the reset gate 250 is spaced from the spacers 500r2 and 500d1, while the other heavily doped regions, 620TR, 620DS, and 620SO, are self-aligned to their corresponding spacers. The lightly doped regions, 420tr, 420rd, 420ds, and 420so, are each divided into two parts, 420tr1/420tr2, 420rd1/420rd2, 420ds1/420ds2, 420so1/420so2, by the heavily doped regions 620TR, 620RD, 620DS, and 620SO, respectively.

The third ion-implantation masks 600B and 600C make the lightly doped regions 420rd2 and 420ds1 different from each other in width at both sides of the source-follower gate (Dg) 260. The width X1 of the lightly doped region 420rd2 is larger than the width X2 of the lightly doped region 420ds1. As also, the lightly doped regions 420tr2 and 420rd1 are different from each other in width at both sides of the reset gate (Rg) 250. The width X3 of the lightly doped region 420rd1 is larger than the width X4 of the lightly doped region 420tr2.

Figure 8:
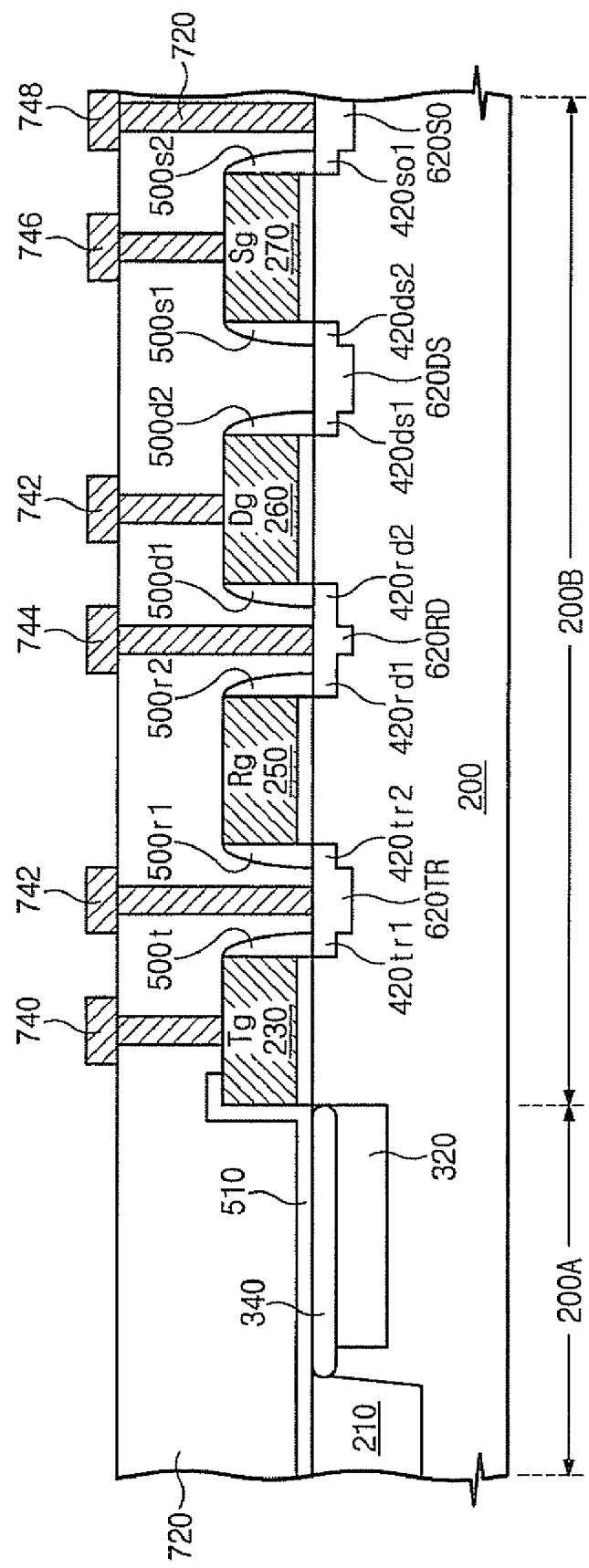

Referring to FIG. 8, after depositing an interlevel insulation film 720 on the overall structure, processing steps are carried out to form contact holes, deposit a metallic film, and pattern the metallic film. Thus, metallic interconnections 740, 742, 744, 746, and 748 are formed thereon. The metallic interconnection 740 is electrically connected to the transfer gate 230 and the metallic interconnection 742 connects the floating diffusion region 620TR electrically with the source-follower gate 260. The metallic interconnection 744 is electrically connected to the heavily doped region 620RD between the reset and source-follower gates 250 and 260, while the metallic interconnection 746 is electrically connected to the selection gate 270. The metallic interconnection 748 is electrically connected with the heavily doped region 620SO at the side of the selection gate 270. These metallic interconnections may be formed using the same processing steps or they may be independently formed using separate processing steps.

Figure 9:
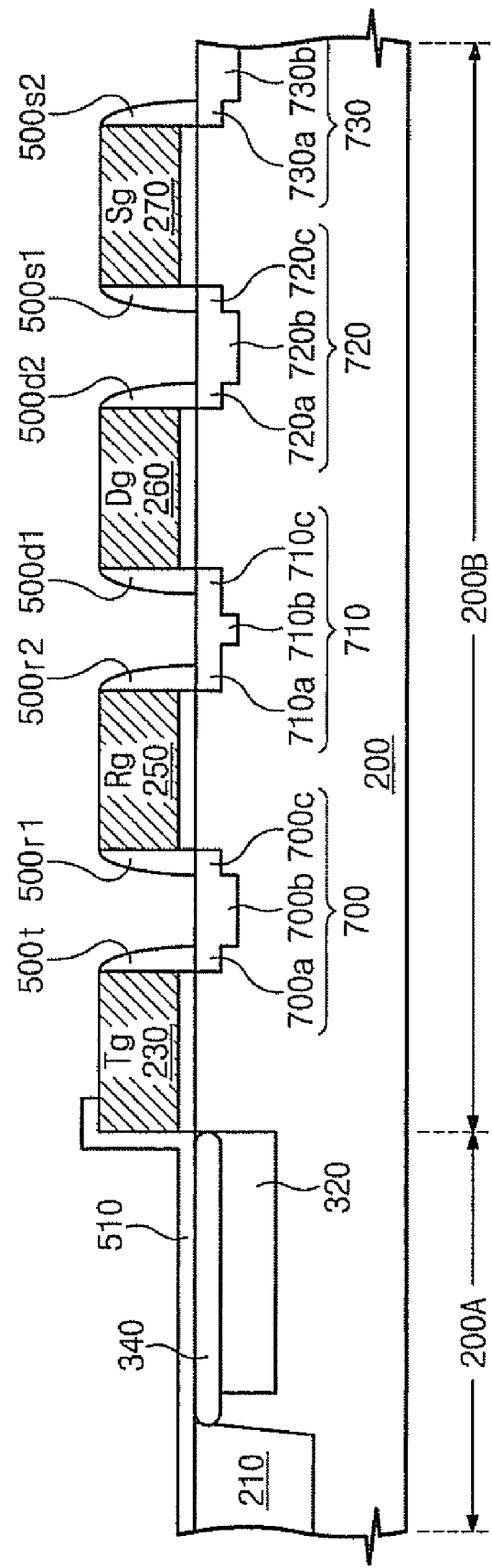

FIG. 9 is a sectional view illustrating the image sensor in accordance with the first embodiment of the invention. Referring to FIG. 9, the field oxide film 210 is formed to define the active regions in the semiconductor substrate 200 including an active pixel sensor block (not shown) and peripheral circuit field (not shown). The photodiode region 320 is formed at the side of the field oxide film 210. The photodiode region 320 is made of an N-type conductive layer with ion impurities of phosphorous (P) or arsenic (As). In addition, the HAD region 340 is further formed on the photodiode region 320 at the surface of the semiconductor substrate 200 to thereby form a P-N junction (i.e., diode with the photodiode region 320). The HAD region 340 is a P-type conductive layer with ion impurities of boron (B) or boron fluoride (BF$_2$). The spacers 500 are formed at the sides of the gate patterns (i.e., the transfer gate 230, the reset gate 250, the source-follower gate 260, and the selection gate 270).

On the surface of the photodiode region 320 and a part of the transfer gate 230, the blocking layer 510 is formed to prevent the photodiode region 320 from defects due to penetration of metallic ions therein. Here, it is preferred for the blocking layer 510 be formed of silicon nitride at the same time with the spacers 500.

Improved layout efficiency can be achieved by configuring the transistors with shared source and drain regions. As an example, the active region 700 between the transfer gate Tg and the reset gate Rg is provided both for a drain region of the transfer transistor Tx (i.e., the floating diffusion region) and a source region of the reset transistor Rx. Namely, the source region of the reset transistor Rx and the drain region of the transfer gate Tg share the same region. The active region 710 between the reset gate Rg and the source-follower gate Dg is shared by drain regions of the reset transistor Rx and the source-follower transistor Dx. As also, the active region 720 between the source-follower gate Dg and the selection gate Sg is shared by a source region of the source-follower transistor Dx and a drain region of the selection transistor Sx.

Referring to FIG. 9, at least in one or more transistors, the lightly doped region of the drain region is different from the lightly doped region of the source region in width. In detail, at least in one or more transistors, the lightly doped region of the drain region is larger than the lightly doped region of the source region in width. For example, the lightly doped region 710c of the drain region 710 in the source-follower transistor Dx is larger than the lightly doped region 720a of the source region 720 in width. And, the lightly doped region 710a of the drain region 710 in the reset transistor Rx is larger than the lightly doped region 700c of the source region 700 in width.

As previously mentioned with reference to FIG. 7, since the heavily doped region 710b of the common drain region 710 in the source-follower and reset transistors Dx and Rx is formed in a self-aligned manner to the spacers 500d1 and 500r1 (by the arrangement of the third ion-implantation masks 600B and 600C), the lightly doped regions 710a and 710c of the drain region 710 are larger than the lightly doped regions 700c and 700a of the source regions 700 and 720 in width.

Figure 10:
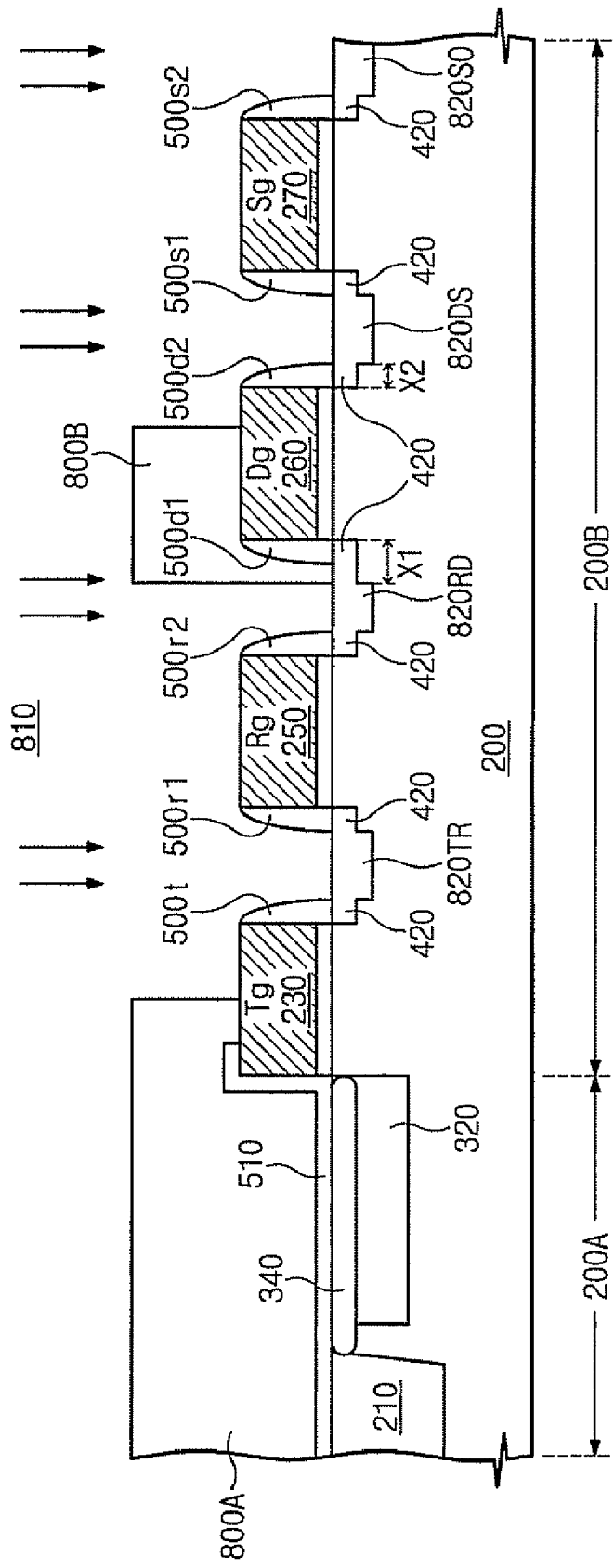

FIG. 10 is a sectional view illustrating processing features for fabricating an image sensor in accordance with a second embodiment of the invention, taken along the line A-A' of FIG. 2 with the exception of the third ion-implantation masks for the heavily doped regions, the processing features of this embodiment are similar to the first embodiment so the same reference numerals are used for the same elements without further detailed description of them. Referring to FIG. 10, third ion-implantation masks 800A and 800B are arranged to form heavily doped regions. The third ion-implantation mask 800A covers the photodiode region 320. For the purpose of defining asymmetrical lightly doped regions at both sidewalls of the source-follower gate (Dg) 260 (i.e., lightly doped regions of a different width), the third ion-implantation mask 500B is formed, such that the third ion implantation mask 500B is formed on a part of the lightly doped region adjacent to the source-follower gate 260. In particular, the third ion-implantation mask 500A is formed on the photodiode region 320 and a part of the transfer gate 230. The third ion-implantation mask 800B is arranged to cover the spacer 500d1 at the sidewall of the source-follower gate 260 and partially the semiconductor substrate 200 adjacent to the spacer 500d1. Here, it is preferred to further form the third ion-implantation mask 800B on a part of the source-follower gate 260.

Ion impurities 810 of phosphorous (P) or arsenic (As) are implanted into the substrate 200 under the third ion-implantation masks 800A and 800B at a dose level in a range between about $1\times10^{15}$ atoms/cm$^2$ and about $9\times10^{15}$ atoms/cm$^2$, to thereby form the heavily doped regions 820TR, 820RD, 820DS, and 820SO of N-type conductive layers. These heavily doped regions are self-aligned to the gate spacers 500t, 500r1, 500r2, 500d2, 500s1, and 500s2, or the third ion-implantation mask 800B. For example, the heavily doped region 820ID outside of the source-follower gate 260 is spaced from the spacer 500d1, but the other heavily doped regions, 820TR, 820DS, and 820SO, are self-aligned to their corresponding spacers. The lightly doped regions, 420tr, 420rd, 420ds, and 420so, are each divided into two parts, 420tr1/420tr2, 420rd1/420rd2, 420ds1/420ds2, 420so1/420so2, by the heavily doped regions 820TR, 820ID, 820DS, and 820SO. In addition, the third ion-implantation mask 800B makes the lightly doped regions 420rd2 and 420ds1 different from each other in width at both sides of the source-follower gate (Dg) 260. The width X1 of the lightly doped region 420rd2 is larger than the width X2 of the lightly doped region 420ds1.

FIG. 11 is a sectional view illustrating the image sensor in accordance with the second embodiment of the invention. Referring to FIG. 11, at least in one or more transistors, the lightly doped region of the drain region is different from the lightly doped region of the source region in width. In detail, at least in one or more transistors, the lightly doped region of the drain region is larger than the lightly doped region of the source region in width. For example, the lightly doped region 910c of the drain region 910 in the source-follower transistor Dx is larger than the lightly doped region 920a of the source region 920 in width.

As aforementioned with reference to FIG. 10, since the heavily doped region 910b of the drain region 910 in the source-follower transistor Dx is formed apart from the spacer 500d1 by the arrangement of the third ion-implantation mask 800B, the lightly doped region 910c of the drain region 910 is larger than the lightly doped region 700a of the source region 920 in width. This asymmetric drain and source width configuration improves dark current generation. Further, in the structure with the transistors, it is preferred that the heavily doped region 920b of the source region 920 is self-aligned to the spacer, while the heavily doped region 910b of the drain region 910 is disposed apart from the spacer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An image sensor device, comprising:
a semiconductor substrate;
a photo-detector in said semiconductor substrate, said photo-detector comprising a charge generating region therein configured to convert photons received by said photo-detector into charge carriers; and
a first transistor having a terminal configured to receive the charge carriers generated by said photo-detector, said first transistor comprising a first gate electrode, a first drain region having highly and lightly doped impurity regions therein and a first source region having highly and lightly doped regions therein;
wherein a first distance between an edge of the highly doped region in the first drain region and one edge of the first gate electrode is greater than a second distance between an edge of the highly doped region in the first source region and another edge of the first gate electrode, the one edge of the first gate electrode being adjacent to the edge of the highly doped region in the first drain region and the another edge of the first gate electrode being opposite to the one edge of the first gate electrode.

2. The image sensor device of claim 1, wherein said first transistor is a three-terminal device; and wherein the terminal configured to receive the charge carriers is selected from a group consisting of a gate, source and drain terminals.

3. The image sensor device of claim 2, wherein said first transistor is selected from a group consisting of a reset transistor and a source-follower transistor.

4. The image sensor device of claim 2, wherein said first transistor is a reset transistor having a first lightly doped drain region and a first lightly doped source region that is narrower than the first lightly doped drain region.

5. The image sensor device of claim 4, wherein the first lightly doped drain region is electrically coupled to a power supply terminal of the image sensor device.

6. The image sensor device of claim 5, further comprising a source-follower transistor having a second lightly doped drain region and a second lightly doped source region that is narrower than the second lightly doped drain region.

7. The image sensor device of claim 6, further comprising a transfer transistor having a first source/drain region electrically connected to the charge generating region and a second source/drain region electrically connected to a floating diffusion region extending in said semiconductor substrate.

8. An image sensor comprising:
a photo-detective element; and
a plurality of transistors electrically coupled to the photo-detective element, each of the transistors having a gate and first and second impurity diffusion regions on opposite sides of the gate, each of the first and second impurity diffusion regions including lightly and heavily doped regions therein,
wherein a first one of the plurality of transistors includes a first gate; and
wherein a first distance between an edge of a heavily doped region in a first impurity region on a first side of the first gate and one edge of the first gate is greater than a second distance between an edge of a heavily doped region in a second impurity region on a second side of the first gate and another edge of the first gate, the one edge of the first gate being adjacent to the edge of the heavily doped region in the first impurity region and the another edge of the first gate being opposite to the one edge of the first gate.

9. The image sensor as set forth in claim 8, wherein the plurality of transistors include transfer, reset, source-follower, and selection transistors,
wherein at least one of the reset and source-follower transistors has the lightly doped regions different from each other in width.

10. The image sensor as set forth in claims 8, wherein each of the transistors further includes a spacer at both sidewalls of the gate.

11. The image sensor as set forth in claim 10, wherein among the highly doped regions of the transistor having the lightly doped regions of a different width, one of the heavily doped regions adjacent to one of lightly doped regions with a smaller width is self-aligned to the spacer, and the other of the heavily doped regions adjacent to the other of the lightly doped regions with a larger width is spaced apart from the spacer.

12. The image sensor as set forth in claim 10, wherein one of the lightly doped regions with a smaller width is self-aligned to a respective spacer and the other of the lightly doped regions with a larger width extends outside of a respective spacer.

13. An image sensor device, comprising:

a semiconductor substrate;

a photo-detector in said substrate, said photo-detector comprising a charge generating region therein configured to convert photons received therein into charge carriers;

first, second and third impurity diffusion regions in said substrate, said first, second and third impurity diffusion regions each having relatively lightly and relatively heavily doped regions therein;

a charge-transfer transistor having a first gate electrode on said substrate, a drain in the charge generating region and a source in said first impurity diffusion region;

a reset transistor having a second gate electrode on said substrate, a drain in said second impurity diffusion region and a source in said first impurity diffusion region; and a source-follower transistor having a third gate electrode on said substrate, a drain in said second impurity diffusion region and a source in said third impurity diffusion region;

wherein a distance between an edge of a relatively heavily doped region in said second impurity region and one edge of the second gate electrode is greater than a distance between another edge of second gate electrode and an edge of a relatively heavily doped region in said first impurity diffusion region, the one edge and the another edge of the second gate electrode being opposite to each other; and wherein a distance between an edge of a relatively heavily doped region in said second impurity diffusion region and one edge of the third gate electrode is greater than a distance between another edge of the third gate electrode and an edge of a relatively heavily doped region in said third impurity diffusion region, the one edge and the another edge of the third gate electrode being opposite to each other.

14. The image sensor device of claim 13, wherein the second impurity diffusion region is electrically connected to a power supply terminal of the image sensor device.

* * * * *